United States Patent [19]

Braun et al.

[11] Patent Number: 4,698,582
[45] Date of Patent: Oct. 6, 1987

[54] POWER DRIVER HAVING SHORT CIRCUIT PROTECTION

[75] Inventors: Jeffrey J. Braun, Chandler, Ariz.; Kenneth M. Cook, Palatine, Ill.

[73] Assignee: Motorola, Inc., Schaumburg, Ill.

[21] Appl. No.: 889,642

[22] Filed: Jul. 23, 1986

[51] Int. Cl.$^4$ .............................................. G05F 1/573
[52] U.S. Cl. ..................................... 323/285; 323/351; 361/86
[58] Field of Search ................................ 323/276–279, 323/283–285, 349–351; 361/86, 87, 100; 307/270

[56] References Cited

U.S. PATENT DOCUMENTS 3,660,753   5/1972   Judd et al. ............................ 323/283
3,796,943   3/1974   Nelson et al. ...................... 323/279 X

OTHER PUBLICATIONS

Nunnery, "Nondissipative Overcurrent Protection for a High-Frequency Power Supply", IBM Technical Disclosure Bulletin, vol. 17, No. 1, Jun. 1974, pp. 162–163.

*Primary Examiner*—Peter S. Wong
*Attorney, Agent, or Firm*—Steven G. Parmelee

[57] ABSTRACT

A power driver having a power transistor (15) uses a disable unit (17) to disable the transistor (15) upon sensing a short circuit condition. No current sense resistors are used. The base-emitter voltage of the transistor (15) is compared by a comparator (14) with a reference signal provided by a reference signal unit (16) to determine the existence or absence of a short circuit condition. In the presence of a short circuit, the comparator (14) provides a fault detected signal to the disable unit (17). The disable unit functions to deny the control signal to the transistor (15) and to ground the base of the power transistor (15) to thereby doubly ensure disablement. In addition, the disable unit (17) has memory and will disable the transistor (15) until the control signal recycles.

12 Claims, 2 Drawing Figures

POWER DRIVER HAVING SHORT CIRCUIT PROTECTION

TECHNICAL FIELD

This invention relates generally to short circuit protection mechanisms, and particularly as implemented in a power driver circuit.

BACKGROUND ART

Many electronic circuits function, at least in part, to provide power to a load to thereby effectuate some intended purpose. In general, such driver circuits include a power transistor that can be operated to make or break a current path that includes the load and the power source.

In many such applications, a short circuit across the load can occur. When this happens, the power transistor used in the driver circuit may become damaged due to excessive current flow. Therefore, various prior art approaches have been proposed to attempt to avoid or minimize the risk of such damage.

Depending upon the application, such prior art approaches may be undesirable or unacceptable due to functioning characteristics, complexity, cost, or response capabilities. Further, many such prior art approaches require the use of a current sense resistor in series with the power transistor. In some application settings, such a resistor should be avoided.

There therefore exists a need for short circuit protection in a power driver that will respond quickly to fault conditions and protect the switch in a relatively simple and cost effective manner, while simultaneously avoiding use of a current sense resistor in series with the power transistor.

SUMMARY OF THE INVENTION

The above needs and others are substantially met through provision of the power driver having short circuit protection disclosed in this specification. This device includes generally a control signal input, a power switch, a comparator, and a disable unit.

The control signal input receives a control signal that provides selective control of the conductive state of the power switch, which itself may be comprised of a power transistor. The power transistor may be placed in series with a load and power source such that the conductive state of the transistor controls the flow of current through the load. The comparator functions to compare a reference signal with a sense signal, the sense signal being a function of the base-emitter voltage for the transistor. When the sense signal exceeds the reference signal, the comparator provides a fault detected signal. The disable unit responds to this fault detected signal to immediately disable the power transistor and terminate the flow of current through the transistor.

In one embodiment, the disable unit can include a memory unit to ensure disablement of the power transistor for an entire control signal cycle. Further, the disable unit can be configured to disable the power transistor in a dual mode approach. In particular, the disable unit can operate to both provide a logic block to inhibit provision of the control signal to the power transistor, and may also function to sink any signal input to the power transistor to thereby completely ensure disablement of the power transistor.

By monitoring the base-emitter voltage of the power transistor, the device avoids use of a current sense resistor located in series with the power transistor. Despite this configuration, the device responds well and with acceptable sensitivity, while still representing an economically feasible approach.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein.

BEST MODE FOR CARRYING OUT THE INVENTION

Figure 1:
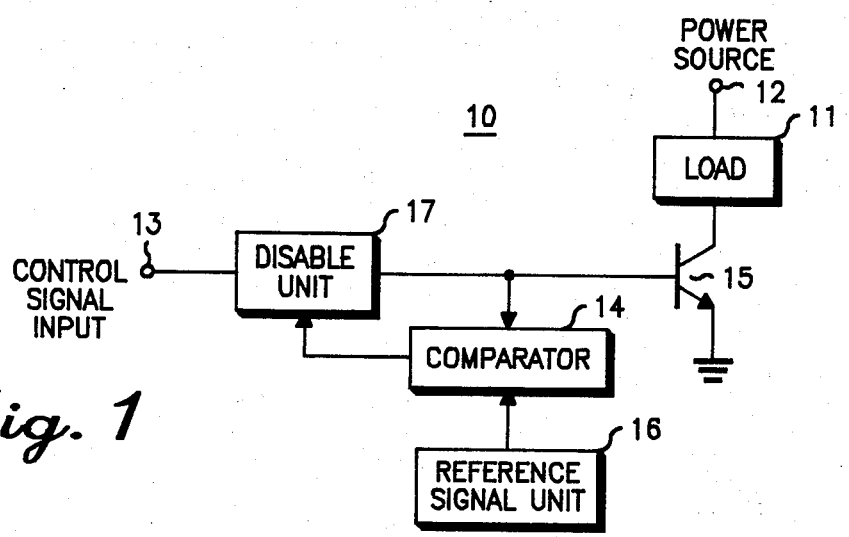
FIG. 1 comprises a block diagram depiction of the invention.

Referring now to FIG. 1, the invention can be seen as depicted generally by the numeral 10. The device (10) operates in conjunction with a load (11) that connects to a power source (12). The device (10) itself generally includes a control signal input (13), a comparator (14), a power transistor (15), a reference signal unit (16), and a disable unit (17).

During normal operation, a control signal as received at the control signal input (13) switches the power transistor (15) on to thereby allow current from the power source (12) to flow through the load (11) and the power transistor (15). The comparator (14) compares the base-emitter voltage of the power transistor (15) against a reference signal provided by the reference signal unit (16). When the former exceeds the latter, thereby indicating that a short circuit across the load (11) has occurred, the comparator (14) provides a fault detected signal to the disable unit (17). The disable unit (17) then functions to disable the power transistor (15).

The above generally referred to components will now be described in more detail in seriatim fashion.

Figure 2:
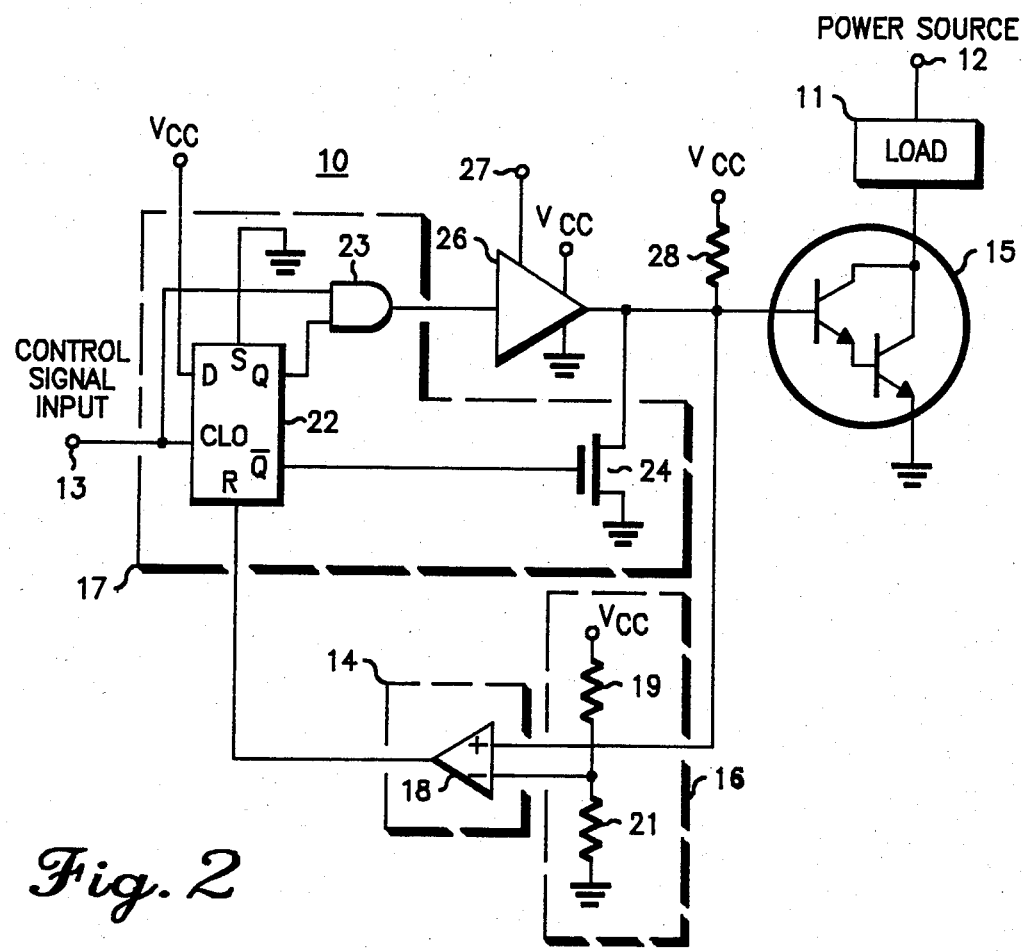
FIG. 2 comprises a schematic diagram of the invention.

Referring to FIG. 2, the power transistor (15) can be comprised of a TIP101 power transistor, the collector of which connects to the load (11) and the emitter of which connects to ground.

The comparator (14) can be comprised of a Motorola 4574 (18), with the noninverting input thereof connected to the base of the power transistor (15) and the inverting input connected to the reference signal unit (16). The output of the comparator (14) connects to the disable unit (17) as described below in more detail.

The reference signal unit (16) includes a voltage divider comprised of two resistors (19 and 21) connected in series between $V_{CC}$ and ground. The intersecting node between these two resistors (19 and 21) connect to the inverting input of the comparator (14). So configured, the reference signal unit (16) will provide a reference signal input to the comparator (14), the value of which depends upon $V_{CC}$ and the value of the resistors (19 and 21), all as well understood in the art. In general, this reference signal value should equate with a base-emitter voltage for the power transistor (15) that corresponds to a short circuit condition across the load (11).

The disable unit (17) can be comprised of a Motorola 4013 flip-flop (22), a Motorola 4081 AND gate (23), and a 4007 FET switch (24). The flip-flop (22) has a clock input that connects to receive the control signal via the control signal input (13) and a reset port that connects to the comparator (14). The Q output port connects to one input of the AND gate (23) and the not Q output connects to the gate of the FET (24). The remaining input to the AND gate (23) connects to the control signal input (13) and the output connects through a tristate buffer (26) (as described below in more detail) to the base of the power transistor (15). The drain of the FET (24) connects to the base of the power transistor (15) and the source connects to ground.

As indicated above, a tristate buffer (26) (such as a Motorola (4503) can be positioned between the output of the AND gate (23) and the base of the power transistor (15). Such a tristate buffer (26) can be utilized in certain applications that make desired use of the enable input (27) and the tristate output options available with such a component.

Finally, a pull-up resistor (28) can be connected between the base of the power transistor (15) and $V_{CC}$.

Operation of the invention (10) will now be generally described.

Upon receiving a control signal at the control signal input (13), the flip-flop (22) will be clocked by the rising edge of the control signal (thereby reenabling the flip-flop (22)) and a high output provided at the Q output thereof to one input of the AND gate (23). With the control signal input (13) high, the remaining input to this AND gate (23) will also be high, thereby providing a high signal through the tristate buffer (26) (presuming its enablement) to the base of the power transistor (15). The power transistor (15) will then be placed in a conducting mode and current will flow from the power source (12) through the load (11) and power transistor (15).

If a short circuit should develop across the load (11), current through the power transistor (15) will rise, and the base-emitter voltage will rise correspondingly. This rise in base-emitter voltage will cause the comparator (14) to provide a fault detected signal to the reset port of the disable unit flip-flop (22). This will cause the Q output port to go low, thereby causing the output of the AND gate (23) to go low and disable the power transistor (15) despite the presence of a control signal at the control signal input (13). Simultaneously, the not Q output of the flip-flop (22) will go high, biasing on the FET (24) and sinking the base of the power transistor (15) to ground, thereby ensuring its disablement.

The flip-flop (22) provides memory to the disable unit (17) insofar as the flip-flop (22) will provide the dual mode disablement described above even if the short circuit event terminates, until the control signal cycles off and on again. Reclocking of the flip-flop (22), of course, will allow the system to reset itself and attempt to again drive the load (11) in the event that the short circuit does prove to be transitory.

The above benefits are obtained without need of a current sense resistor, and with a minimum of parts. At the same time, the device (10) has the attributes of dual mode disablement and disablement memory coupled with automatic resetting capabilities Those skilled in the art will recognize that the above described device (10) could be modified to suit various applications without departing from the spirit of the invention. It should therefore be understood that the claims are not to be viewed as being limited to the particular embodiments described, in the absence of specific recitations expressly directed to such embodiments.

We claim:

1. A power driver with short circuit protection comprising:
   (a) control signal input means for receiving a control signal;
   (b) power switch means responsive to said control signal for completing a current path through a load, said power switch means including a transistor having a base and an emitter;
   (c) comparator means for comparing a reference signal with a sense signal, said sense signal being a function of base-emitter voltage for said transistor, and for providing a fault detected signal when said sense signal exceeds said reference signal; and
   (d) disable means responsive to said fault detected signal for disabling said transistor.

2. The power driver with short circuit protection of claim 1 wherein said disable means includes a flip-flop that responds to said control signal by providing an output signal that enables said power switch means to complete said current path.

3. The power driver with short circuit protection of claim 1 and further including a tristate buffer operably connected between said control signal input means and said base of said transistor.

4. The power driver with short circuit protection of claim 1 wherein said disable means further functions to provide dual mode disablement, such that a first disablement of said transistor comprises removing said control signal from said power switch means, and a second disablement mechanism comprises connecting said base of said transistor to ground.

5. The power driver with short circuit protection of claim 4 wherein said disable means includes a flip-flop, with one output of said flip-flop providing an enabling signal that, when removed, terminates provision of said control signal to said power switch means, and another output of said flip-flop functions to enable a switch that connects said base of said transistor to ground.

6. The power driver with short circuit protection of claim 1 wherein said disable means includes
   (a) a flip-flop for receiving said control signal and said fault detected signal and for selectively providing an enabling signal at one output and a disabling signal at a second output in response thereto;
   (b) an AND gate having a first input connected to receive the control signal and a second input connected to receive the enabling signal of said flip-flop, and an output connected to provide said control signal to said base of said transistor; and
   (c) an FET connected to be responsive to said disabling signal from said flip-flop to connect said base of said transistor to ground.

7. The power driver with short circuit protection of claim 6 and further including a tristate buffer having an input connected to said output of said AND gate and an output connected to said base of said transistor.

8. The power driver with short circuit protection of claim 1 wherein said disable means includes memory means for causing said disable means to continuously disable said transistor, once a fault detected signal has been provided by said comparator means, until a reenable signal has been provided to said memory unit.

9. The power driver with short circuit protection of claim 8 wherein said control signal has a rising edge and wherein said reenable signal comprises said rising edge.

10. The power driver with short circuit protection of claim 9 wherein said memory means includes a flip-flop having a clock port connected to said control signal input such that said rising edge of said control signal causes said flip-flop to clock.

11. A power driver with short circuit protection comprising:
  (a) control signal input means for receiving a control signal;
  (b) power switch means responsive to said control signal for completing a current path through a load, said power switch means including a transistor having a base and an emitter;
  (c) comparator means having a first input connected to receive a predetermined reference signal and a second input connected to said base of said transistor for receiving base-emitter voltage information, for providing a fault detected signal when said base-emitter voltage information exceeds said reference signal; and
  (d) disable means responsive to said fault detected signal for disabling said transistor, said disable means including:
    (i) a flip-flop having a clock input for receiving said control signal, a reset port connected to receive said fault detected signal from said comparator means, a Q output port, and a not Q output port;
    (ii) an AND gate having a first input connected to receive said control signal, a second input connected to said Q output port of said flip-flop, and an output for providing an enabling signal to said transistor; and
    (iii) an FET having a gate connected to said not Q output of said flip-flop and power terminals connected between said base of said transistor and ground.

12. The power driver with short circuit protection of claim 11 and further including a tristate buffer having an input connected to said output of said AND gate and an output connected to said base of said transistor.

* * * * *